(12) United States Patent
Ritter et al.

(10) Patent No.: US 9,279,702 B2
(45) Date of Patent: Mar. 8, 2016

(54) CIRCUIT AND MEASURING SYSTEM

(71) Applicant: Micronas GmbH, Freiburg (DE)

(72) Inventors: Joachim Ritter, Loerrach (DE); Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 114 days.

(21) Appl. No.: 14/154,995

(22) Filed: Jan. 14, 2014

(65) Prior Publication Data

US 2014/0197822 A1 Jul. 17, 2014

(30) Foreign Application Priority Data

Jan. 14, 2013 (DE) .......................... 10 2013 000 431

(51) Int. Cl.
| | | |
|---|---|---|
| *G01B 7/30* | (2006.01) | |
| *G01R 33/09* | (2006.01) | |
| *G01D 5/16* | (2006.01) | |
| *G01D 5/14* | (2006.01) | |
| *G01R 33/07* | (2006.01) | |

(52) U.S. Cl.
CPC .................. *G01D 5/16* (2013.01); *G01D 5/145* (2013.01); *G01R 33/072* (2013.01); *G01R 33/091* (2013.01)

(58) Field of Classification Search
CPC .................................. G01B 7/30; G01R 33/09
USPC .................................. 324/173, 207.21, 207.25
See application file for complete search history.

(56) References Cited

U.S. PATENT DOCUMENTS

| | | | | |
|---|---|---|---|---|
| 4,319,188 A | * | 3/1982 | Ito ........................... | G01D 5/145 324/173 |
| 4,785,242 A | | 11/1988 | Vaidya et al. | |
| 6,894,487 B2 | | 5/2005 | Kunz-Vizenetz | |
| 6,965,227 B2 | | 11/2005 | Blossfeld | |
| 7,096,593 B2 | | 8/2006 | Schmied | |
| 7,307,414 B2 | | 12/2007 | Ito et al. | |
| 7,420,363 B2 | | 9/2008 | Hatanaka et al. | |
| 2008/0044119 A1 | | 2/2008 | Aoki et al. | |
| 2010/0097059 A1 | | 4/2010 | Estrada et al. | |
| 2011/0187351 A1 | | 8/2011 | Hunger | |
| 2011/0291650 A1 | | 12/2011 | Franke et al. | |

(Continued)

FOREIGN PATENT DOCUMENTS

| | | |
|---|---|---|
| DE | 103 34 869 B3 | 9/2004 |
| DE | 103 49 556 A1 | 6/2005 |

(Continued)

OTHER PUBLICATIONS

Joachim Quasdorf, "Auflösung von Winkelmessungemerhöhen," Elektronik Praxis, vol. 18, pp. 22-26 (Sep. 17, 2008).

*Primary Examiner* — Tung X Nguyen
*Assistant Examiner* — Neel Shah
(74) *Attorney, Agent, or Firm* — Muncy, Geissler, Olds & Lowe, P.C.

(57) ABSTRACT

A measuring system having a first magnetic field sensor, a second magnetic field sensor, an encoder, and an evaluation circuit to which the first magnetic field sensor and the second magnetic field sensor are connected. The evaluation circuit generates a first signal and a second measurement signal. The encoder generates a second magnetic field change with a second periodicity. The evaluation circuit generates a second signal with the second periodicity from the first measurement signal of the first magnetic field sensor and the second measurement signal of the second magnetic field sensor according to an absolute value function.

16 Claims, 4 Drawing Sheets

(56) References Cited

U.S. PATENT DOCUMENTS

| | | |
|---|---|---|
| 2012/0095712 A1 | 4/2012 | Komasaki et al. |
| 2012/0262157 A1 | 10/2012 | Liebart |
| 2013/0027028 A1 | 1/2013 | Hohe et al. |
| 2013/0221956 A1 | 8/2013 | Kotani et al. |

FOREIGN PATENT DOCUMENTS

| | | |
|---|---|---|
| DE | 10 2004 010 948 A1 | 10/2005 |
| DE | 10 2005 049 312 A1 | 4/2007 |
| DE | 10 2007 009 585 A1 | 9/2007 |
| DE | 10 2007 022 196 A1 | 11/2007 |
| DE | 10 2008 059 401 A | 6/2010 |
| DE | 10 2010 003 292 A1 | 9/2011 |
| DE | 10 2010 019 508 A1 | 11/2011 |
| EP | 1 111 392 A1 | 6/2001 |
| EP | 1 477 772 A1 | 11/2004 |
| EP | 1 503 182 B1 | 12/2008 |
| EP | 2 339 299 A2 | 6/2011 |
| EP | 2 354 769 A1 | 8/2011 |
| JP | 2003-194901 A | 7/2003 |
| WO | WO 2012/060216 A1 | 5/2012 |
| WO | WO 2013/050535 A2 | 4/2013 |

\* cited by examiner

CIRCUIT AND MEASURING SYSTEM

This nonprovisional application claims priority to German Patent Application No. DE 10 2013 000 431.4, which was filed in Germany on Jan. 14, 2013, and which is herein incorporated by reference.

BACKGROUND OF THE INVENTION

1. Field of the Invention

The present invention relates to a circuit and a measuring system.

2. Description of the Background Art

EP 2 354 769 A1, which corresponds to US 20110187351, which is incorporated herein by reference, discloses an angle sensor and a method for determining an angle between a sensor system and a magnetic field. The angle sensor has a magnetic field-generating magnet, which is adjustable with regard to a rotation axis in different rotational positions relative to the sensor system. The sensor system has a first magnetic field sensor for detecting a first magnetic field component, oriented transversely to the rotation axis, and a second magnetic field sensor for detecting a second magnetic field component, situated transversely to plane extending from the rotation axis and the first magnetic field component. The sensor system has a third magnetic field sensor for detecting a third magnetic field component oriented in the direction of the rotation axis.

DE 10 2008 059 401 A1, which corresponds to US 20110291650, discloses a semiconductor chip and a method for generating pulse edges, assigned synchronously to the movement of a mechanical part. A magnetic field is generated and at least two measurement signals for the magnetic field are detected. The magnetic field is changed as a function of the movement of the mechanical part in such a way that the measurement signals are modulated phase-shifted to one another. A first measurement signal is compared with a first reference value. A second measurement signal is compared with a second reference value. The value of the first measurement signal is compared with the value of the second measurement signal. A pulse edge is generated when at least one of these comparisons produces an agreement or the result of the relevant comparison changes its sign.

EP 1 111 392 A1, which corresponds to U.S. Pat. No. 6,965,227, which is incorporated herein by reference, discloses a detection of the rotational speed and angular position of a rotating wheel with an adjustable switching threshold for drift compensation. The detection of the rotational speed and angular position of a wheel occurs by means of a non-contact sensor which scans the wheel and generates a pulse train. The amplitude of the pulse is compared in a comparator with a variable switching threshold. The switching threshold is adjusted so that the value of the difference between the pulse amplitude and the switching threshold does not exceed a predefinable maximum value.

An optical nonius system is known from ELEKTRONIK PRAXIS, No. 18, 17 Sep. 2008, page 22, by J. Quasdorf. The interpolation of analog sine signals is an evaluation function in the case of position sensors. It is possible with a special method to evaluate a number of measurement scales and to combine them to form a position value. Measuring systems are possible thereby that offer a high integral accuracy or very high resolutions with good differential precision. A small optical sensor is sufficient for the scanning.

A rotation angle sensor is known from EP 1 503 182 B1, which corresponds to U.S. Pat. No. 6,894,487, as is illustrated in FIG. 1. The rotation angle sensor has a rotary shaft, a magnet coupled to the rotary shaft, and a magnet-sensitive sensor element. The sensor element generates a sinusoidal and a cosinusoidal output signal as a function of the relative rotation angle between the magnet and the sensor. The rotation angle sensor has an evaluation unit, which generates a signal corresponding to the rotation angle from the output signals. In addition, the shaft is movably guided linearly parallel to its axis along a guide track during its rotation around its axis, so that the distance between the magnet and sensor changes according to a pitch of the guide track. The evaluation unit determines from the output signals of the sensor element a signal from which the distance between the sensor element and the magnet and thereby the number of full rotations of the shaft are determined. A fine signal within a full rotation is determined from the sinusoidal and cosinusoidal output signals and this fine signal is added to the value of the full rotation multiplied by 360°.

SUMMARY OF THE INVENTION

It is therefore an object of the present invention to provide a measuring system that refines the state of the art.

Accordingly, a measuring system is provided with a magnetic field sensor array and with a rotationally movable encoder and with an evaluation circuit.

The magnetic field sensor array has a first magnetic field sensor, integrated into a semiconductor chip, for measuring a first component of a magnetic field in a first spatial direction and a second magnetic field sensor, integrated into a semiconductor chip, for measuring a second component of the magnetic field in a second spatial direction.

The rotationally movable encoder has a plurality of magnets, which with each rotation of the encoder by means of a plurality of pole pairs generate a rotation angle-dependent first magnetic field change with a first periodicity in the magnetic field sensor array.

The first magnetic field sensor and the second magnetic field sensor are connected to the evaluation circuit.

The evaluation circuit is set up to generate a first signal with the first periodicity from a first measurement signal of the first magnetic field sensor and a second measurement signal of the second magnetic field sensor according to an arc tangent function.

The rotary encoder is designed to generate a rotation angle-dependent second magnetic field change with a second periodicity in the magnetic field sensor array. A period of the second periodicity corresponds to a rotation of the encoder.

The evaluation circuit is set up to generate a second signal with the second periodicity from the first measurement signal of the first magnetic field sensor and the second measurement signal of the second magnetic field sensor according to an absolute value function.

The evaluation circuit has a logic, which is set up to determine a rotation angle of the encoder based on the first signal and the second signal.

A measuring system is provided with a magnetic field sensor array and with an encoder, movable along a track, and with an evaluation circuit.

The magnetic field sensor array has a first magnetic field sensor, integrated into a semiconductor chip, for measuring a first component of a magnetic field in a first spatial direction and a second magnetic field sensor, integrated into a semiconductor chip, for measuring a second component of the magnetic field in a second spatial direction.

The encoder, movable along the track, has a plurality of magnets, which with a movement of the encoder along the track by means of a plurality of pole pairs generate a path-dependent first magnetic field change with a first periodicity in the magnetic field sensor array.

The first magnetic field sensor and the second magnetic field sensor are connected to the evaluation circuit.

The evaluation circuit is set up to generate a first signal with the first periodicity from a first measurement signal of the first magnetic field sensor and a second measurement signal of the second magnetic field sensor according to an arc tangent function.

The encoder is designed to generate a path-dependent second magnetic field change with a second periodicity in the magnetic field sensor array. The second periodicity is greater than the first periodicity.

The evaluation circuit is set up to generate a second signal with the second periodicity from the first measurement signal of the first magnetic field sensor and the second measurement signal of the second magnetic field sensor according to an absolute value function.

The evaluation circuit has a logic, which is set up to determine a position of the encoder based on the first signal and the second signal.

Accordingly, a measuring system is provided with a magnetic field sensor array and with a rotationally movable encoder and with an evaluation circuit.

The magnetic field sensor array has a first magnetic field sensor, integrated into a semiconductor chip, for measuring a first component of a magnetic field in a first spatial direction and a second magnetic field sensor, integrated into a semiconductor chip, for measuring a second component of the magnetic field in a second spatial direction and a magnet.

The rotationally movable encoder has a plurality of teeth. A material of the teeth influences the magnetic field of the magnet.

The teeth of the encoder are designed with each rotation of the encoder to generate a rotation angle-dependent first magnetic field change with a first periodicity in the magnetic field sensor array.

The first magnetic field sensor and the second magnetic field sensor are connected to the evaluation circuit.

The evaluation circuit is set up to generate a first signal with the first periodicity from a first measurement signal of the first magnetic field sensor and a second measurement signal of the second magnetic field sensor according to an arc tangent function.

The encoder is designed to generate a rotation angle-dependent second magnetic field change with a second periodicity in the magnetic field sensor array. A period of the second periodicity corresponds to a rotation of the encoder.

The evaluation circuit is set up to generate a second signal with the second periodicity from the first measurement signal of the first magnetic field sensor and the second measurement signal of the second magnetic field sensor according to an absolute value function.

The evaluation circuit has a logic, which is set up to determine a rotation angle of the encoder based on the first signal and the second signal.

In an embodiment, a measuring system is provided with a magnetic field sensor array and with an encoder, movable along a track, and with an evaluation circuit.

The magnetic field sensor array has a first magnetic field sensor, integrated into a semiconductor chip, for measuring a first component of a magnetic field in a first spatial direction and a second magnetic field sensor, integrated into a semiconductor chip, for measuring a second component of the magnetic field in a second spatial direction and a magnet.

The encoder, movable along the track, has a plurality of teeth. A material of the teeth influences the magnetic field of the magnet.

The teeth of the encoder are designed during a movement of the encoder along the track to generate a path-dependent first change in the magnetic field with a first periodicity in the magnetic field sensor array.

The first magnetic field sensor and the second magnetic field sensor are connected to the evaluation circuit.

The evaluation circuit is set up to generate a first signal with the first periodicity from a first measurement signal of the first magnetic field sensor and a second measurement signal of the second magnetic field sensor according to an arc tangent function.

The encoder is designed to generate a path-dependent second magnetic field change with a second periodicity in the magnetic field sensor array. The second periodicity is greater than the first periodicity.

The evaluation circuit is set up to generate a second signal with the second periodicity from the first measurement signal of the first magnetic field sensor and the second measurement signal of the second magnetic field sensor according to an absolute value function.

The evaluation circuit has a logic, which is set up to determine a position of the encoder based on the first signal and the second signal.

Many advantages are achieved by the solutions, elucidated heretofore, for the object by the features of the claims 1 to 4. A high resolution of the position can be achieved by the plurality of magnets of the encoder, or by the plurality of teeth of the encoder. In synergy, moreover, the position within the rotation of the encoder can be obtained unambiguously from the same measurement signals. An additional sensor is not necessary.

According to an embodiment, the arc tangent function is:

$$D=\arctan(A/B) \tag{1}$$

D is the first signal, A is the first measurement signal, and B is the second measurement signal.

According to an embodiment, the absolute value function is:

$$C=|A|+|B| \tag{2}$$

C is the second signal, A is the first measurement signal, and B is the second measurement signal. Alternatively, a different arc tangent function or a different absolute value function can be provided.

It is provided in an advantageous embodiment that a period of the second periodicity corresponds to a stretch between the endpoints of the track. For example, the second signal changes proportionally to the covered stretch between the two endpoints.

According to an advantageous refinement, the encoder is designed to generate the second magnetic field change by means of a change in an air gap width between the encoder and the magnetic field sensor array. It can be provided alternatively that at least one magnet of the encoder has a magnetization different from that of its magnets.

In a further advantageous refinement, the logic is setup to compare a result of the absolute value function with a number of threshold values. If the result of the absolute value function is compared, for example, with a single value, a zero position of the encoder can be determined. A greater number of threshold values, as is used, for example, in an analog-to-digital converter with several bits, enables a position range determination of the encoder. The position range determination in this case preferably has a coarser resolution than the first signal.

The previously described refinement variants are especially advantageous both individually and in combination. In this regard, all refinement variants can be combined with one another. Some possible combinations are explained in the description of the exemplary embodiments shown in the figures. These possible combinations of the refinement variants, depicted therein, are not definitive, however.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
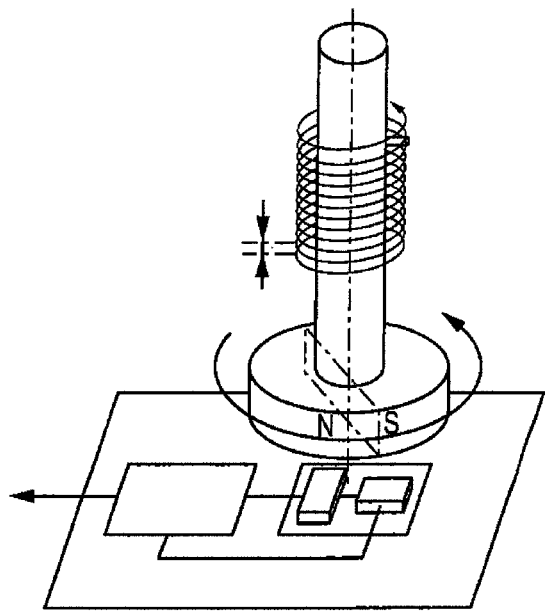
FIG. 1 shows a measuring system according to the conventional art.
Figure 2:
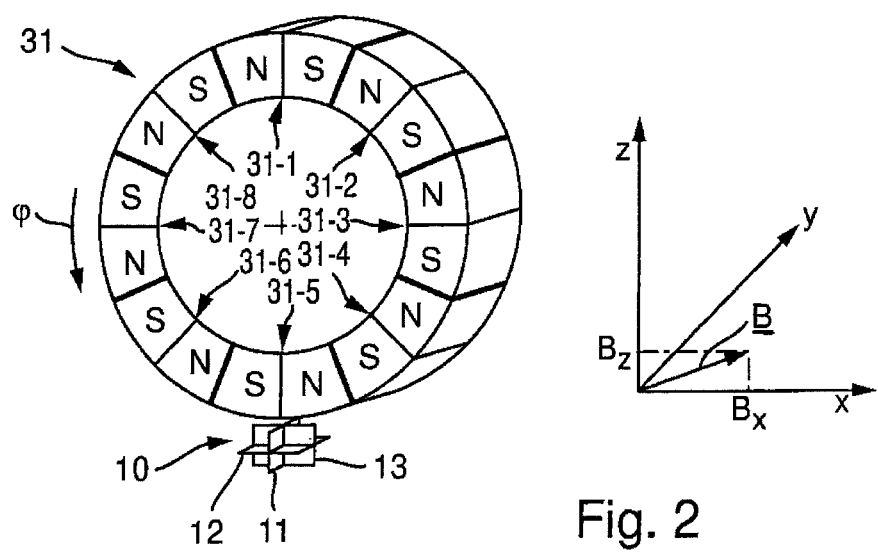
FIG. 2 shows a schematic view of an exemplary embodiment of a measuring system.

A measuring system is illustrated schematically in FIG. 2. The measuring system has a magnetic field sensor array 10. A magnetic field vector B is determined in magnetic field sensor array 10. The magnetic field vector B is illustrated schematically in FIG. 2 in a coordinate system with the spatial directions x, y, and z. For better understandability of the illustration, the origin of the coordinate system is shown offset from the middle of magnetic field sensor array 10. Components $B_x$, $B_z$ of the magnetic field vector B are also shown in the coordinate system.

Magnetic field sensor array 10 has a first magnetic field sensor 11, integrated into a semiconductor chip, for measuring a first component $B_x$ of the magnetic field vector B of the magnetic field in a first spatial direction x. Magnetic field sensor array 10 has a second magnetic field sensor 12, integrated into the semiconductor chip, for measuring a second component $B_z$ of the magnetic field vector B of the magnetic field in a second spatial direction z. In addition, magnetic field sensor array 10 has a third magnetic field sensor 13, integrated into the semiconductor chip, for measuring a third component $B_y$ of the magnetic field vector B of the magnetic field in a third spatial direction y.

The measuring system of FIG. 2 has a rotationally movable encoder 31 in the form of a pole wheel. Pole wheel 31 has a number of magnets, which with each rotation of pole wheel 31 by means of a plurality of pole pairs 31-1, 31-2, 31-3, 31-4, 31-5, 31-6, 31-7, 31-8 generate a rotation angle-dependent first magnetic field change with a first periodicity $T_1$ in the magnetic field sensor array 10. Pole wheel 31 as rotatory encoder 31 is formed with eight pole pairs 31-1, 31-2, 31-3, 31-4, 31-5, 31-6, 31-7, 31-8, to generate a rotation angle-dependent second magnetic field change with a second periodicity $T_2$ in the magnetic field sensor array 10. A period of the second periodicity $T_2$ corresponds to a rotation of pole wheel 31. Thus, the second magnetic field change repeats with each rotation of pole wheel 31. In this case, pole pairs 31-1, 31-2, 31-3, 31-4, 31-5, 31-6, 31-7, 31-8 in magnetic field sensor array 10 generate the magnetic field vector B with different lengths. The second magnetic field change in the exemplary embodiment of FIG. 2 is thereby a magnetic field amplitude modulation, which overlaps the first magnetic field change. With the second magnetic field change, for example, the length of the magnetic field vector B increases continuously from the first pole pair 31-1 to the last pole pair 31-8 in a rotation direction. In this case, the amplitude modulation for the second magnetic field change has a sawtooth shape.

Figure 10:
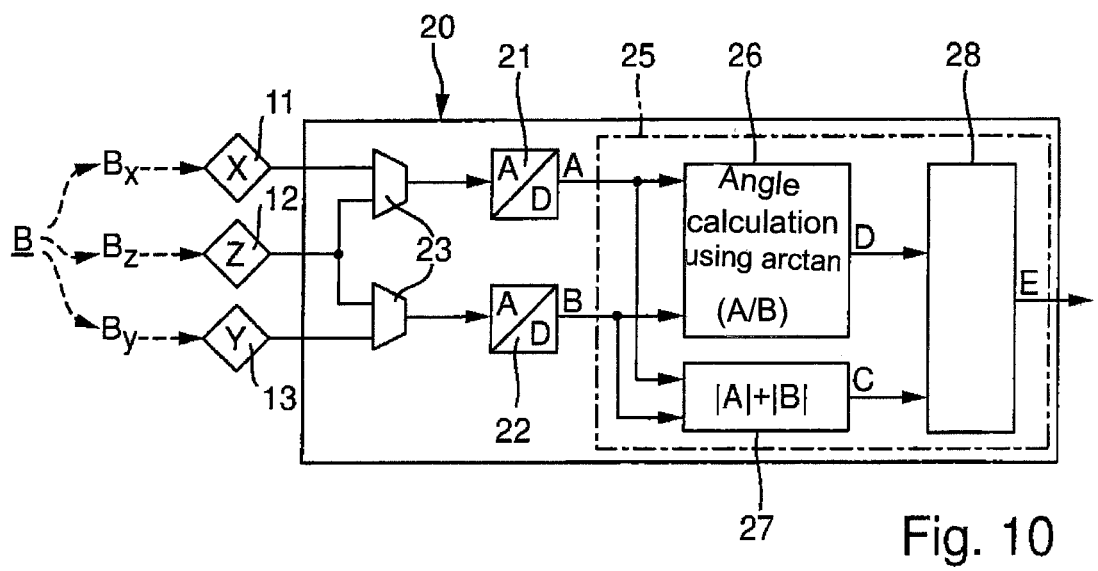
FIG. 10 shows a schematic block circuit diagram of a further exemplary embodiment of a measuring system.

An evaluation circuit 20 of the measuring system is shown in FIG. 10. First magnetic field sensor 11 and second magnetic field sensor 12 and third magnetic field sensor 13 are connected to evaluation circuit 20. Evaluation circuit 20 has a first analog-to-digital converter 21 and a second analog-to-digital converter 22. The analog output signals of magnetic field sensors 11, 12, 13 can be connected to the inputs of analog-to-digital converters 21, 22 by means of multiplexers 23. Depending on the position of evaluation circuit 20, magnetic field sensors 11, 12, 13, necessary for the measuring task, can thus be selected. Alternatively to the exemplary embodiment of FIG. 10, an analog-to-digital converter can be provided for each magnetic field sensor 11, 12, 13. In this case, signals would be selected on the digital side and multiplexers 23 could be omitted. Alternatively, a single fast analog-to-digital converter could also be used, and the analog signals of magnetic field sensors 11, 12, 13 are switched in rapid succession cyclically to the input of the single analog-to-digital converter by means of a multiplexer.

It is to be assumed hereinafter for the exemplary embodiment of FIG. 10 that first magnetic field sensor 11 is switched to first analog-to-digital converter 21 and second magnetic field sensor 12 to second analog-to-digital converter 22.

Evaluation circuit 20 has a logic 25, whereby in FIG. 10 several function blocks 26, 27, 28 of logic 25 are illustrated schematically. Function blocks 26, 27, 28 are realized, for example, by software or special hardware. Evaluation circuit 20 is set up to generate by means of function block 26 a first signal D with the first periodicity from a first measurement signal A of first magnetic field sensor 11 and a second measurement signal B of second magnetic field sensor 12 according to an arc tangent function:

$$D = \arctan(A/B) \quad (1)$$

Evaluation circuit 20 is set up to generate by means of function block 27 a second signal C with the second periodicity from the first measurement signal A of first magnetic field sensor 11 and the second measurement signal B of second magnetic field sensor 12 according to an absolute value function:

$$C = |A| + |B| \quad (2)$$

Logic 25 is set up by means of function block 28 to determine a rotation angle cp of pole wheel 31 based on the first signal D and the second signal C.

Figure 7:
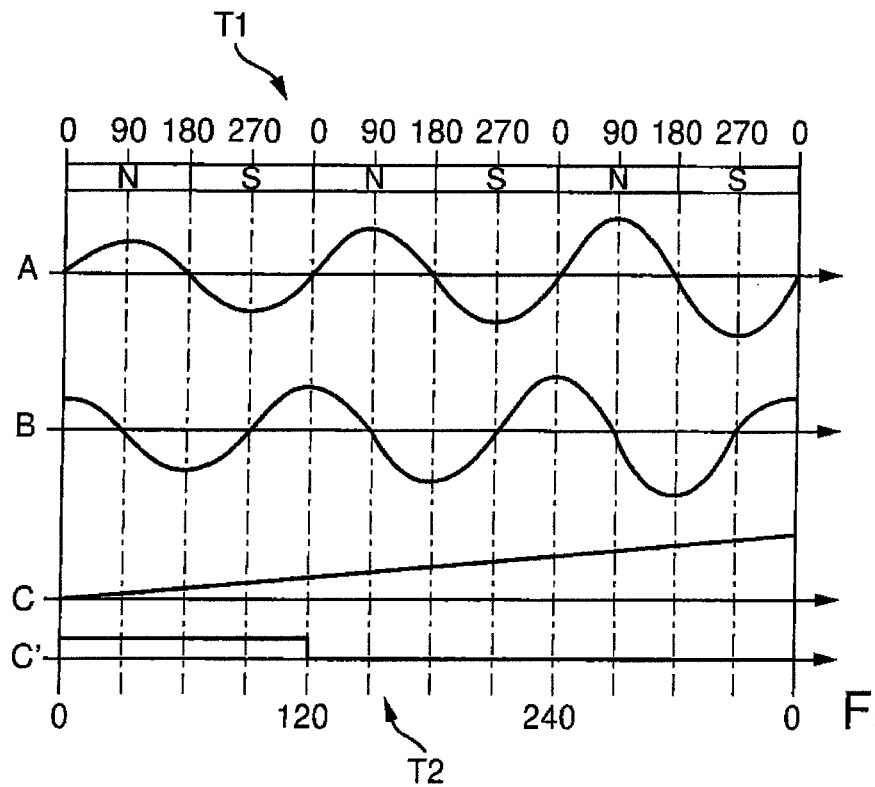
FIG. 7 shows a schematic diagram with measurement signals of a further exemplary embodiment of a measuring system.

A course of the signals A, B, and C is illustrated schematically in FIG. 7 for a further exemplary embodiment with three pole pairs. The first measurement signal A is phase-shifted by 90° versus the second measurement signal B (sine and cosine). The second signal C obtained by the absolute value function has a sawtooth shape. In the exemplary embodiment of FIG. 7, the period of the second periodicity $T_2$ is three times as large as the period of the first periodicity $T_1$. The arc tangent function represents the fundamental frequency (pole pair). The absolute value function allows differentiation of a plurality of pole pairs from one another.

A further exemplary embodiment is illustrated schematically in FIG. 7 in that no sawtooth signal shape but an increase in amplitude for precisely one pole pair according to the type of a rectangular function according to the signal C' is produced. The pole pair with the increase in amplitude can be evaluated as a zero point, whereby the other rotation angles are determined by counting the pole pairs after the zero point. This embodiment is especially robust to disturbances because of the digital nature of the rectangular shape, and permits a precise rotation angle determination only after passing the zero point.

The exemplary embodiments of FIGS. 3, 4, 5, and 6 show different measuring systems, which also cause a change in the length of the magnetic field vector B.

Figure 3:
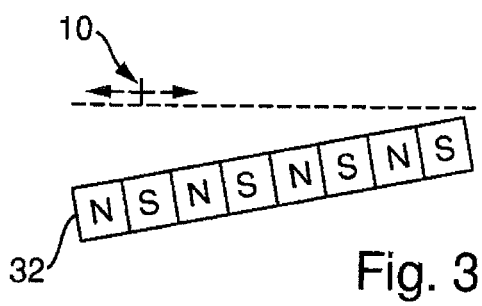
FIG. 3 shows a schematic view of a further exemplary embodiment of a measuring system.

In the exemplary embodiment of FIG. 3, magnetic field sensor array 10 executes a relative movement toward encoder 32 along the dashed line. Encoder 32 again has a plurality of pole pairs. Accordingly, encoder 32 is movable along a straight track. The magnets of encoder 32 with a movement of encoder 32 along the track by means of the pole pairs generate a path-dependent first magnetic field change with a first periodicity in magnetic field sensor array 10. In this regard, the magnets of encoder 32 are arranged in such a way that depending on the position of encoder 32 a distance between the magnets of encoder 32 and magnetic field sensor array 10 is changed to generate the second periodicity. In this regard, the length of the magnetic field vector increases with a decrease in the distance.

Figure 4:
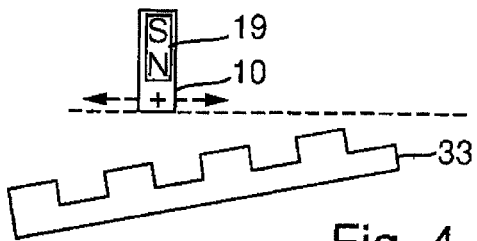
FIG. 4 shows a schematic view of a further exemplary embodiment of a measuring system.

In the exemplary embodiment of FIG. 4, encoder 33 has a plurality of teeth. The teeth influence a magnetic field in a magnetic field sensor array 10. Magnetic field sensor array 10 has a magnet 19 for this purpose. Encoder 33 is movable along a track relative to magnetic field sensor array 10, so that magnetic field sensor array 10 executes a relative movement along the dashed line. The teeth of encoder 33 are designed, during a movement of encoder 33 along the track, to generate a path-dependent first change of the magnetic field with a first periodicity in magnetic field sensor array 10. In this regard, the teeth of encoder 35 are arranged in such a way that depending on the movement of encoder 33 a distance between the tips of the teeth of encoder 33 and magnetic field sensor array 10 is changed to generate a second periodicity. In this regard, the length of the magnetic field vector increases with a decrease in the distance.

Figure 5:
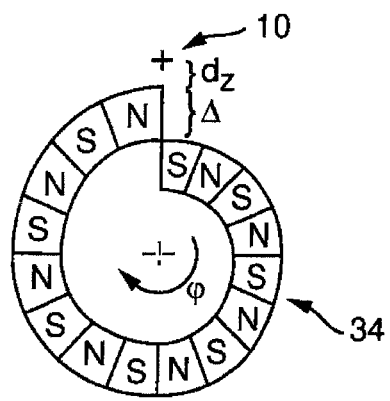
FIG. 5 shows a schematic view of a further exemplary embodiment of a measuring system.

In the exemplary embodiment of FIG. 5, encoder 34 is a pole wheel 34. Pole wheel 34 has a plurality of magnets for forming pole pairs. The magnets of encoder 34 with a rotation of encoder 34 by means of the pole pairs generate a path-dependent first magnetic field change with a first periodicity in magnetic field sensor array 10. In this case, the magnets of encoder 34 are arranged in such a way that depending on the rotation angle φ of encoder 34 a distance between the magnets of encoder 34 and magnetic field sensor array 10 is changed. In this regard, the length of the magnetic field vector increases with a decrease in the distance.

Figure 6:
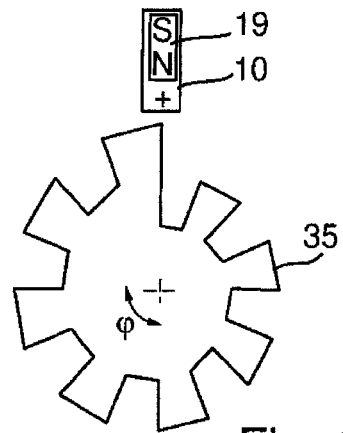
FIG. 6 shows a schematic view of a further exemplary embodiment of a measuring system.

In the exemplary embodiment of FIG. 6, encoder 35 is a toothed wheel 35 with a plurality of teeth. The teeth influence a magnetic field in a magnetic field sensor array 10. Magnetic field sensor array 10 has a magnet 19 for this purpose. Encoder 35 is rotationally movable. In this regard, the teeth of encoder 35 are formed in such a way that depending on the rotation angle φ of encoder 35 a distance between the tips of the teeth of encoder 35 and magnetic field sensor array 10 is changed to generate the second periodicity. In this regard, the length of the magnetic field vector increases with a decrease in the distance.

In the exemplary embodiments of FIGS. 3 to 6, a relative movement between encoder 35 and magnetic field sensor array 10 is possible. In this regard, magnetic field sensor array 10 can be stationary and encoder 35 can be moved. It is likewise possible to arrange encoder 35 as stationary and to move magnetic field sensor array 10. It is also possible to move both encoder 35 and magnetic field sensor array 10.

Figure 8:
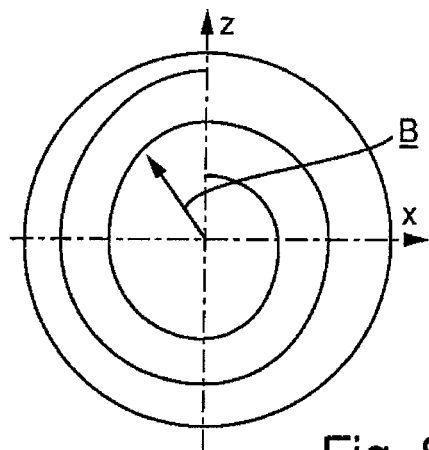
FIG. 8 shows a schematic diagram of a course of a magnetic field vector of a further exemplary embodiment of a measuring system.

A further exemplary embodiment is shown schematically in FIG. 8. FIG. 8 shows a magnetic field vector B and its course as a function of a movement of an encoder of a measuring system. Each mechanical rotation produces an absolute value, increasing clockwise, for the magnetic field strength, which is determined and calculated from a sinusoidal magnetic field by two magnetic field sensors, offset by 90°, for a sine measurement signal and a cosine measurement signal. The magnetic amplitude increases clockwise, so that a plurality of magnetic pole pairs within a rotation and pole pairs beyond both rotations can be differentiated from one another. In this illustration, the length of the arrow B corresponds to the absolute value and the direction of the angle of the magnetic field.

Figure 9:
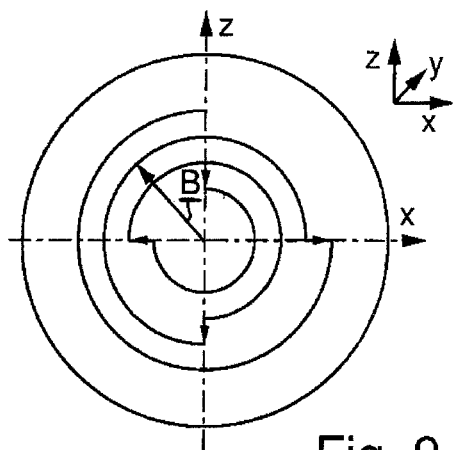
FIG. 9 shows a schematic diagram of a course of a magnetic field vector of a further exemplary embodiment of a measuring system.

With only two spatial directions x, y, with no modulation in the other spatial direction z, a number of rotations or a number of pole pairs, following one another on a straight line, can be reliably differentiated, as long as there is no crossing of the line, described by the course of the magnetic vector B. An exemplary embodiment with this type of crossing of the line, described by the course of the magnetic vector B, is illustrated in FIG. 9. Continuous rotation during crossing allows ambiguities to arise. An instance, which the history knows, can resolve these ambiguities. The absolute value can change continuously according to FIG. 8, which leads to a spiral shape. If the absolute value changes in jumps according to FIG. 9, this results in a stepped spiral shape. In the two exemplary embodiments of FIGS. 8 and 9, at least two pole pairs can be differentiated within each rotation.

Figure 11:
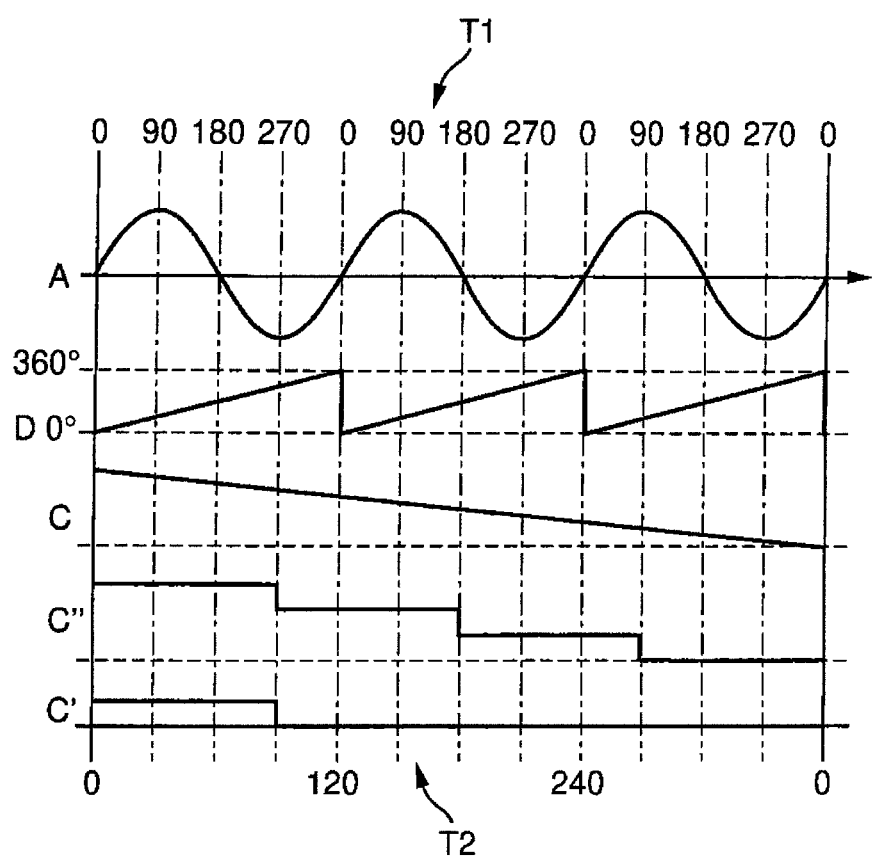
FIG. 11 shows a schematic diagram with measurement signals of a further exemplary embodiment of a measuring system.

FIG. 11 shows an exemplary embodiment with three pole pairs in the form of a diagram. The signals here relate to FIG. 10. A sine signal A produced by the pole pair is shown at the very top. The signal D of the starting value of the arc tangent function is shown below it. The absolute value signal C is formed as a falling sawtooth signal. In addition, FIG. 11 shows a signal C'' of an absolute value function, whereby the absolute value changes stepwise in four steps. In addition, a zero point can occur with use of signal C' by means of a comparator.

The invention is not limited to the shown embodiment variants in FIGS. 2 to 11. For example, it is possible to use different absolute value functions. It is also possible to provide different encoders with a more complex array of magnets. The functionality of the measuring system according to FIGS. 2 and 10 can be used especially advantageously for an adjustment system or drive system.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring system comprising:
a magnetic field sensor array having a first magnetic field sensor integrated into a semiconductor chip for measuring a first component of a magnetic field in a first spatial direction, and a second magnetic field sensor integrated into a semiconductor chip for measuring a second component of the magnetic field in a second spatial direction, wherein the first spatial direction is orthogonal to the second spatial direction;
a movable encoder that has a plurality of pole pairs which generate a position-dependent first magnetic field change with a first periodicity in the magnetic field sensor array; and
an evaluation circuit connectable to the first magnetic field sensor and the second magnetic field sensor, the evaluation circuit adapted to generate a first signal with the first periodicity from a first measurement signal of the first magnetic field sensor and a second measurement signal of the second magnetic field sensor according to an arc tangent function,
wherein the moveable encoder is configured to generate a position-dependent second magnetic field change with a second periodicity in the magnetic field sensor array,
wherein the evaluation circuit is configured to generate a second signal with the second periodicity from the first measurement signal of the first magnetic field sensor and the second measurement signal of the second magnetic field sensor according to an absolute value function, and
wherein the evaluation circuit has a logic, which is configured to determine a position of the moveable encoder based on the first signal and the second signal.

2. The measuring system according to claim 1, wherein the encoder generates the second magnetic field change via a change in an air gap width between the encoder and the magnetic field sensor array.

3. The measuring system according to claim 1, wherein the logic compares a result of the absolute value function with a plurality of threshold values.

4. The measuring system according to claim 1, wherein the encoder is a rotatory encoder that has a plurality of magnets, with each rotation of the encoder via a plurality of pole pairs.

5. The measuring system according to claim 4, wherein a period of the second periodicity corresponds to a rotation of the moveable encoder, and wherein the position determined by the evaluation circuit is an angular position.

6. A measuring system comprising:
a magnetic field sensor array having a first magnetic field sensor integrated into a semiconductor chip for measuring a first component of a magnetic field in a first spatial direction, and a second magnetic field sensor integrated into a semiconductor chip for measuring a second component of the magnetic field in a second spatial direction;
an encoder that is movable and has a plurality of magnets, which with a movement of the encoder via a plurality of pole pairs generate a path-dependent first magnetic field change with a first periodicity in the magnetic field sensor array, wherein the first spatial direction is orthogonal to the second spatial direction; and
an evaluation circuit connected to the first magnetic field sensor and the second magnetic field sensor,
wherein the evaluation circuit is adapted to generate a first signal with the first periodicity from a first measurement signal of the first magnetic field sensor and a second measurement signal of the second magnetic field sensor according to an arc tangent function,
wherein the encoder is adapted to generate a path-dependent second magnetic field change with a second periodicity in the magnetic field sensor array, the second periodicity being greater than the first periodicity,
wherein the evaluation circuit is adapted to generate a second signal with the second periodicity from the first measurement signal of the first magnetic field sensor and the second measurement signal of the second magnetic field sensor according to an absolute value function, and
wherein the evaluation circuit has a logic that is adapted to determine a position of the encoder based on the first signal and the second signal.

7. The measuring system according to claim 6, further comprising a track which the encoder is moveable along, wherein a period of the second periodicity corresponds to a stretch between endpoints of a track.

8. The measuring system according to claim 6, wherein the encoder is movable along a track.

9. The measuring system according to claim 6, wherein the encoder is a rotatory encoder that has a plurality of magnets, with each rotation of the encoder via a plurality of pole pairs.

10. The measuring system according to claim 9, wherein the path-dependent first magnetic field change is a rotation angle-dependent magnetic field change and the path-dependent second magnetic field change is a rotation angle-dependent magnetic field change.

11. A measuring system comprising:
a magnetic field sensor array having a first magnetic field sensor integrated into a semiconductor chip for measuring a first component of a magnetic field in a first spatial direction, a second magnetic field sensor integrated into a semiconductor chip for measuring a second component of the magnetic field in a second spatial direction, and a magnet, wherein the first spatial direction is orthogonal to the second spatial direction;
a movable encoder influencing a magnetic field of the magnet, to generate a position-dependent first magnetic field change with a first periodicity in the magnetic field sensor array; and
an evaluation circuit connectable to the first magnetic field sensor and the second magnetic field sensor,
wherein the evaluation circuit is adapted to generate a first signal with the first periodicity from a first measurement signal of the first magnetic field sensor and a second measurement signal of the second magnetic field sensor according to an arc tangent function,
wherein the encoder generates a position-dependent second magnetic field change with a second periodicity in the magnetic field sensor array, the second periodicity being greater than the first periodicity, wherein the evaluation circuit generates a second signal with the second periodicity from the first measurement signal of the first magnetic field sensor and the second measurement signal of the second magnetic field sensor according to an absolute value function, and wherein the evaluation circuit has a logic that determines a position of the encoder based on the first signal and the second signal.

12. The measuring system according to claim 11, wherein the encoder is movable along a track.

13. The measuring system according to claim 11, wherein the moveable encoder is a rotationally moveable encoder that has teeth, a material of the teeth influencing a magnetic field of the magnet, the teeth of the encoder adapted to, with each rotation of the encoder, generate the position-dependent first magnetic field change, wherein the position-dependent first magnetic field change is a rotation angle-dependent first magnetic field change.

14. The measuring system according to claim 11, wherein the position-dependent second magnetic field change is a rotation angle-dependent second magnetic field change, wherein a period of the second periodicity corresponds to a rotation of the encoder, and wherein the position determined by the evaluation circuit is a rotation angle position.

15. A measuring system comprising:
a magnetic field sensor array having a first magnetic field sensor integrated into a semiconductor chip for measuring a first component of a magnetic field in a first spatial direction and a second magnetic field sensor integrated into a semiconductor chip for measuring a second component of the magnetic field in a second spatial direction, and a magnet, wherein the first spatial direction is orthogonal to the second spatil direction;

an encoder being movable to generate a path-dependent first change of the magnetic field with a first periodicity in the magnetic field sensor array; and an evaluation circuit connected to the first magnetic field sensor and the second magnetic field sensor, wherein the evaluation circuit generates a first signal with the first periodicity from a first measurement signal of the first magnetic field sensor and a second measurement signal of the second magnetic field sensor according to an arc tangent function, wherein the encoder generates a path-dependent second change of the magnetic field with a second periodicity in the magnetic field sensor array, the second periodicity being greater than the first periodicity, wherein the evaluation circuit generates a second signal with the second periodicity from the first measurement signal of the first magnetic field sensor and the second measurement signal of the second magnetic field sensor according to an absolute value function, and wherein the evaluation circuit has a logic that determines a position of the encoder based on the first signal and the second signal.

16. The measuring system according to claim 15, wherein the encoder is moveable along a track and having teeth, a material of the teeth influencing a magnetic field of the magnet, the teeth of the encoder, during a movement of the encoder along the track, generate the path-dependent first change.

* * * * *